United States Patent
Effertz et al.

(10) Patent No.: US 11,680,922 B2
(45) Date of Patent: Jun. 20, 2023

(54) WINDOW PANE WITH CAPACITIVE SENSOR

(71) Applicant: SAINT-GOBAIN GLASS FRANCE, Courbevoie (FR)

(72) Inventors: Christian Effertz, Aachen (DE); Klaus Schmalbuch, Aachen (DE); Patrick Weber, Alsdorf (DE); Hans-Georg Esser, Aachen (DE)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 672 days.

(21) Appl. No.: 16/468,107

(22) PCT Filed: Nov. 7, 2017

(86) PCT No.: PCT/EP2017/078382
§ 371 (c)(1),
(2) Date: Jun. 10, 2019

(87) PCT Pub. No.: WO2018/103975
PCT Pub. Date: Jun. 14, 2018

(65) Prior Publication Data
US 2020/0096467 A1 Mar. 26, 2020

(30) Foreign Application Priority Data

Dec. 9, 2016 (EP) .................................... 16203228

(51) Int. Cl.
*G01N 27/22* (2006.01)
*B32B 17/10* (2006.01)
(Continued)

(52) U.S. Cl.
CPC ..... *G01N 27/223* (2013.01); *B32B 17/10036* (2013.01); *B32B 17/10183* (2013.01);
(Continued)

(58) Field of Classification Search
CPC .... G01N 27/223; G01N 27/22; G01N 27/227; G01R 27/2605; B60S 1/0825
See application file for complete search history.

(56) References Cited

U.S. PATENT DOCUMENTS 6,094,981 A   8/2000 Hochstein
8,009,053 B2  8/2011 Veerasamy
(Continued)

FOREIGN PATENT DOCUMENTS

CN          101283281 A      10/2008
DE   10 2008 043610 A1       5/2010
(Continued)

OTHER PUBLICATIONS

International Search Report as issued in International Patent Application No. PCT/EP2017/078382, dated Apr. 23, 2018.

*Primary Examiner* — Amy He
(74) *Attorney, Agent, or Firm* — Pillsbury Winthrop Shaw Pittman LLP

(57) ABSTRACT

A composite pane for separating an interior space from an external environment, includes an inner pane, an outer pane with an inner surface, and an intermediate layer that areally joins the inner surface of the outer pane to an outer surface of the inner pane, a capacitive sensor for detecting moisture having at least one capacitor that is connected to an electronic sensor unit, which is provided for detecting a change in capacitance of the capacitor, wherein the capacitor has at least two electrodes formed from a transparent, electrically conductive coating, which are capacitively coupled.

15 Claims, 7 Drawing Sheets

Figure 1:
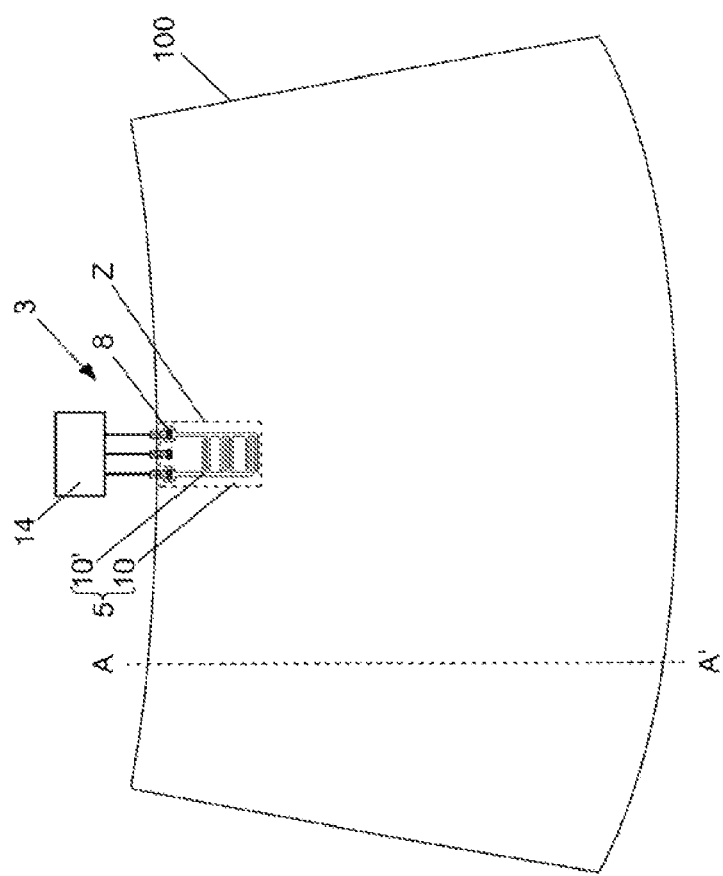

(51) Int. Cl.
  *B32B 38/10* (2006.01)
  *H01G 2/02* (2006.01)
  *H01G 11/24* (2013.01)
  *G01R 27/26* (2006.01)
  *B60J 1/02* (2006.01)
  *B60J 1/18* (2006.01)
  *B60S 1/08* (2006.01)

(52) U.S. Cl.
  CPC .. *B32B 17/10211* (2013.01); *B32B 17/10807* (2013.01); *B32B 38/10* (2013.01); *G01R 27/2605* (2013.01); *H01G 2/02* (2013.01); *H01G 11/24* (2013.01); *B32B 17/1055* (2013.01); *B32B 2255/20* (2013.01); *B32B 2307/202* (2013.01); *B32B 2310/00* (2013.01); *B32B 2457/16* (2013.01); *B32B 2605/006* (2013.01); *B60J 1/02* (2013.01); *B60J 1/18* (2013.01); *B60S 1/0825* (2013.01)

(56) References Cited

U.S. PATENT DOCUMENTS

| | | | |
|---|---|---|---|
| 2003/0002238 A1* | 1/2003 | Toyoda | G01N 27/225 361/302 |
| 2009/0039901 A1 | 2/2009 | DeLatte et al. | |
| 2009/0223238 A1 | 9/2009 | Tanaka et al. | |

FOREIGN PATENT DOCUMENTS

| | | |
|---|---|---|
| DE | 10 2009 029079 A1 | 3/2011 |
| EA | 020100 B1 | 8/2014 |
| EP | 1 306 276 A2 | 5/2003 |
| EP | 2 139 049 A1 | 12/2009 |
| EP | 2 200 097 A1 | 6/2010 |
| JP | H05-264496 A | 10/1993 |
| JP | 2009-505038 A | 2/2009 |
| JP | 2009-522168 A | 6/2009 |
| RU | 2381954 C2 | 2/2010 |
| RU | 2574850 C2 | 2/2016 |
| WO | WO 2007/009973 A1 | 1/2007 |

* cited by examiner

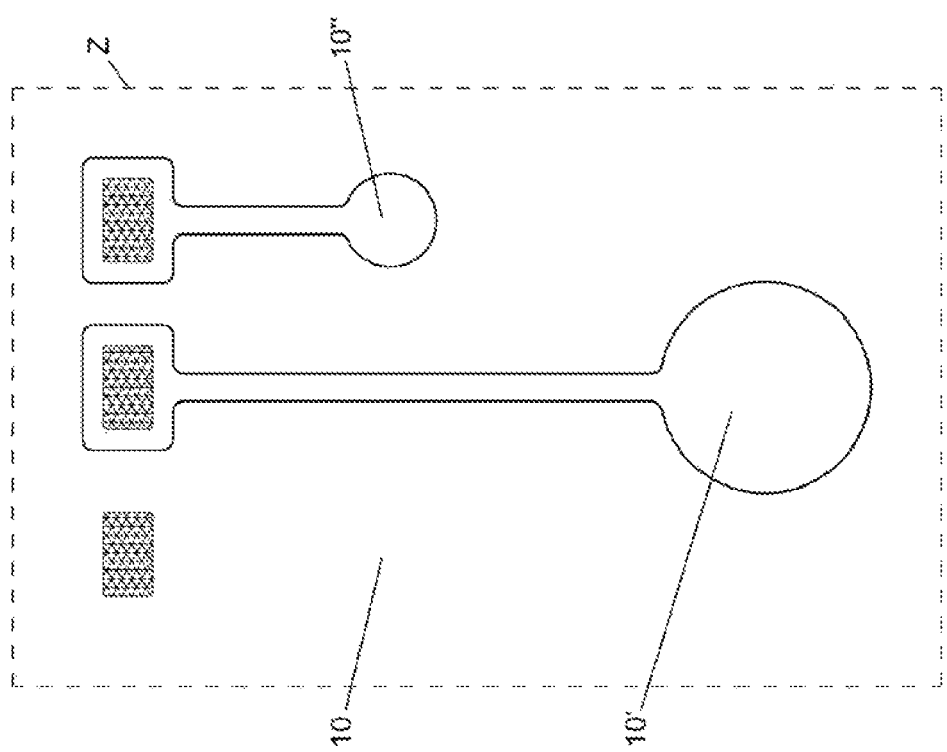

WINDOW PANE WITH CAPACITIVE SENSOR

CROSS-REFERENCE TO RELATED APPLICATIONS

This application is the U.S. National Stage of PCT/EP2017/078382, filed Nov. 7, 2017, which in turn claims priority to European patent application number 16203228.8 filed Dec. 9, 2016. The content of these applications are incorporated herein by reference in their entireties.

The invention relates to a composite pane with a capacitive sensor, a method for producing the composite pane, and use thereof.

Windshields of motor vehicles are often equipped with a large number of functions. A windshield is usually a composite pane that comprises an inner pane, an outer pane, and an intermediate layer areally joining the two panes. The intermediate layer contains a plastic, e.g., polyvinyl butyral (PVB), ethylene vinyl acetate (EVA), and/or polyethylene terephthalate (PET). The functions of the windshield are controlled by sensors, e.g., even a rain sensor that automatically detects rain on the windshield. The rain sensor serves to automatically control the function of the windshield wiper as a function of rain or moisture detected on the windshield without the driver having to intervene.

The rain sensors frequently used are light sensors that have a photoelement for detecting light beams. Light that is reflected on the outer surface of the windshield by total reflection and is directed to the photoelement is coupled into a section of the windshield. The photoelement measures the light intensity and prepares a measurement signal as a function thereof. By means of a change or reduction in the measurement signal, the rain on the windshield is detected and the wiper function on the windshield is triggered. Such a rain sensor requires a significant amount of space, in particular on the inner side of the windshield. The individual components of the rain sensor extended to the interior of the motor vehicle.

Also known are capacitors that are used for rain sensors. These capacitors are commonly stray-field capacitors that are arranged on a windshield and in which the stray-field capacitance changes as a function of the rain present on the windshield. Known from DE 10 2009 029 079 is a stray-field capacitor that has a centrally or eccentrically arranged reference electrode and another counter electrode. The two electrodes are arranged in a common electrode plane, with the counter electrode surrounding the reference electrode but galvanically separated therefrom. Between the reference electrode and at least one counter electrode, an electrical field is generated, which extends into a dielectric space outside the windshield. For this purpose, the electrodes are connected in each case to a plus or a minus pole of a supply voltage source. The rain that has fallen on the windshield changes the electrical field and, consequently, the capacitance of the stray-field capacitor. Such a stray-field capacitor must be laboriously applied on the windshield, restricts the driver's through-vision with an increasing number of electrodes on the composite pane, and is prone to erroneous messaging in the detection of rain. Furthermore, such a stray-field capacitor can indeed report the presence of rain but cannot detect the intensity of the rain.

The object of the present invention consists in providing an improved composite pane that has a sensor that can be simply and economically integrated into the window pane and has a high level of reliability and effectiveness.

The object of the present invention is accomplished according to the invention by a composite pane with a capacitive sensor as described hereinafter, a method for producing a composite pane, and use thereof. Preferred embodiments are apparent from the dependent claims.

The composite pane according to the invention comprises at least the following features:
- an inner pane,
- an outer pane with an inner surface, and
- an intermediate layer that areally joins the inner surface of the outer pane to an outer surface of the inner pane,
- a capacitive sensor for detecting moisture having at least one capacitor that is connected to an electronic sensor unit, which is provided for detecting a change in capacitance of the capacitor,
- wherein the capacitor has at least two electrodes formed from a transparent, electrically conductive coating, which are capacitively coupled.

The composite pane is provided for separating an interior space from an external environment. The composite pane according to the invention includes an inner pane and an outer pane. The term "inner pane" refers to that pane that faces the interior of the vehicle in the installed position. The composite pane is provided in an opening, in particular a window opening of a vehicle, to separate the interior from the external environment. The term "outer pane" refers to that pane that faces the external environment of the vehicle in the installed position. The composite pane can be used in many ways: In the case of a composite pane as a vehicle window, it can, for example, be a roof panel, a windshield, a rear window, a side window, or another glazing delimiting the vehicle interior. Here, "outer surface" of the pane means the surface of the pane that faces outward, i.e., away from the vehicle interior. Accordingly, "inner surface" means the surface of the pane that faces the vehicle interior.

The invention is based on the idea that an electronic sensor unit mounted on the composite pane takes up much space and, at the same time, has a disruptive effect on through-vision for a driver. As a result of the composite pane according to the invention with a capacitor, which has two electrodes formed from a transparent, electrically conductive coating, the capacitor can be integrated into the composite pane in a simple manner. Vision through the composite pane is not impaired thereby, and the capacitor can be placed more simply and more space-savingly on the composite pane. Particularly in the case of modern vehicles with complex windshields, space-saving integration of sensor technology is particularly important.

The transparent, electrically conductive coating has heat-reflecting properties. Such a coating is a layer system that includes a functional layer. The functional layer is usually made of an electrically conductive oxide (TCO), preferably indium tin oxide (ITO), fluorine-doped tin oxide ($SnO_2$:F), antimony-doped tin oxide ($SnO_2$:Sb), aluminum-doped zinc oxide (ZnO:Al), and/or gallium-doped zinc oxide (ZnO:Ga). The coating is electrically conductive and has, in the visible spectral range, low absorption and lower reflection and, consequently, high transmittance. The composite pane can have, at least partially or over its entire surface, the transparent, electrically conductive coating on an inner or outer surface of the inner pane, outer pane, intermediate layer, or in the intermediate layer, with the capacitor and the electrodes electrically isolated from the coating by at least one coating-free separating line.

Particularly advantageous electrodes according to the invention are provided for generating a sensor area on the composite pane, in particular an outer surface, within which the moisture on the composite pane causes a change in capacitance. Between two electrodes of the capacitor, an electrical field is produced that extends into a space above the composite pane and defines the sensor area. The space above the composite pane can include air, water, or other contaminants and deposits. As a result of the arrangement of the sensor area on the composite pane, a fast response of the sensor is ensured. The sensor area can be arranged in the upper section of the composite pane, preferably centrally.

In an advantageous embodiment, the electronic sensor unit is provided to generate a signal when moisture, including rain, is detected on the sensor area. Expediently, a windshield wiper system of the vehicle is triggered only if the electronic sensor unit has generated a corresponding signal.

The capacitive sensor can have one or a plurality of capacitors, in particular $2^n$ and a maximum of 32 capacitors, wherein the electronic sensor unit is provided to generate a plurality of signals and has means for calculating a correlation of the signals. As a result, the electronic sensor unit can reliably determine whether rain is or is not present on the composite pane. This calculation of the correlation of the signals is useful for applicational cases in which the objective is to obtain, within a short time, a meaningful signal for triggering the windshield wiper system. This is the case if rain that begins during driving disrupts the driver's view and the windshield wiper system should respond quickly and reliably. Thus, the normal operating case can be distinguished from rain.

The means of the electronic sensor unit are provided for calculating an autocorrelation and/or a cross-correlation of the signals. A further improvement of the composite pane with a capacitive sensor consists in that the autocorrelation calculation delivers a result indicating whether rain is or is not present on the composite pane. If the result of the autocorrelation is greater than 1, rain is present on the composite pane. Based on this conclusion, the windshield wiper function is triggered. Based on the cross-correlation, it is possible to verify, simply and with low technical outlay, the presence of rain; and, thus, resistance to contaminant-induced malfunctions can be increased. The mathematical method of cross-correlation determines the similarity of two signals when they are temporally shifted by a specific amount.

In another advantageous embodiment of the invention, the electrodes are asymmetric. By means of the asymmetric implementation of the electrodes, undesirable interference with electromagnetic fields generated by adjacent electrical conductors and devices is avoided.

In order to further improve electromagnetic compatibility, the electrodes have different-sized areas.

Advantageously, at least one electrode is comb-shaped. The comb-shaped electrode has an elongated comb back, on which a plurality of comb teeth are arranged. The comb teeth are mutually parallel and arranged perpendicular to the comb back, creating an electrode with comb-shaped teeth. Surprisingly, it has been found that such a design of the at least one electrode delivers almost no false signals, meaning the electronic sensor unit generates a switching signal although no rain is present on the windshield.

Equally advantageously, two comb-shaped electrodes are intermeshed. Like the teeth of two combs, the electrode surfaces intermesh, but remain isolated from one another by a separating line. The electrical field between the comb teeth of the comb-shaped electrodes has, in sections, approx. parallel field lines.

It has also proved advantageous for two comb-shaped electrodes to be arranged back to back.

Alternatively, or additionally, the electrodes can be tulip-shaped or spiral-shaped, in particular a hyperbolic spiral. This shape of the electrodes is also particularly suited for reliable detection of rain on the composite pane.

The composite pane can be a windshield of a vehicle, in which the electrodes are arranged on the surface of the outer pane or of the inner pane facing the intermediate layer. Alternatively, or additionally, the electrodes can be arranged on or in the intermediate layer. The electrodes extend in a common plane of the composite pane, in particular in a plane parallel to the outer surface of the outer pane. Thus, an electrical field that the rainwater on the composite pane penetrates is formed between at least two electrodes.

In a possible embodiment, the windshield can have additional electrodes in different planes of the windshield that serve to increase the precision of measurement and, for example, compensate temperature effects such as a capacitance drift due to a change in temperature of the glass and of the PVB. Due to the fact that these compensation electrodes lie in a different plane (preferably farther from the vehicle exterior), the effect of rain on the structures is weaker, whereas temperature changes, in particular while the vehicle is stationary, can also affect these sensor structures.

The composite pane can have one or a plurality of capacitive sensors for detecting moisture, preferably rain. The sensors can be arranged along one edge of a wiper field of the composite pane.

The intermediate layer is preferably transparent. The intermediate layer preferably includes at least one plastic, preferably polyvinyl butyral (PVB), ethylene vinyl acetate (EVA), and/or polyethylene terephthalate (PET). The intermediate layer can, however, also include, for example, polyurethane (PU), polypropylene (PP), polyacrylate, polyethylene (PE), polycarbonate (PC), polymethyl methacrylate, polyvinyl chloride, polyacetate resin, casting resins, acrylates, fluorinated ethylenepropylenes, polyvinyl fluoride, and/or ethylene-tetrafluoroethylene, or copolymers or mixtures thereof. The intermediate layer can be formed by one or even by a plurality of films arranged one atop another. The intermediate layers can preferably be thermoplastic and, after lamination, adhesively bond the inner pane, the outer pane, and any other intermediate layers to one another.

Another aspect of the invention includes a method for producing a composite pane with a capacitive sensor for detecting moisture, at least comprising:

(a) Applying a transparent, electrically conductive coating on one surface of the inner pane, of the outer pane, or of the intermediate layer; and introducing at least one separating line, which electrically divides the transparent, electrically conductive coating into at least two capacitively coupled electrodes, preferably by laser patterning or by mechanical or chemical ablation, and (b) Producing a stack sequence comprising the inner pane, an intermediate layer, and an outer pane, wherein the intermediate layer is arranged between the inner surface of the outer pane and the outer surface of the inner pane, and laminating the stack sequence to form a composite pane.

The application of the transparent, electrically conductive coating can be done by methods known per se, preferably by magnetron-enhanced cathodic sputtering. This is particularly advantageous in terms of simple, quick, economical, and uniform coating of the panes. However, the transparent, electrically conductive coating can also be applied, for example, by vapor deposition, chemical vapor deposition (CVD), plasma-enhanced chemical vapor deposition (PECVD), or by wet chemical methods.

The de-coating of individual separating lines in the transparent, electrically conductive coating is preferably done by a laser beam. Methods for patterning thin metal films are known, for example, from EP 2 200 097 A1 or EP 2 139 049 A1. The width of the de-coating is preferably 10 µm to 1000 µm, particularly preferably 30 µm to 200 µm, and in particular 70 µm to 140 µm. In this range, a particularly clean and residue-free de-coating occurs with the laser beam. The de-coating by laser beam is particularly advantageous since the de-coated lines are very unobtrusive visually and have very little negative impact on appearance and through-vision. The de-coating of a line with a width that is wider than the width of one laser cut is done by repeatedly tracing the line with the laser beam. Consequently, the duration and costs of the process increase with increasing line width. Alternatively, the de-coating can be done by mechanical ablation as well as by chemical or physical etching.

The laminating, i.e., the bonding of the inner pane, intermediate layer, and outer pane, is preferably done under the action of heat, vacuum, and/or pressure. Methods known per se for producing a composite pane can be used.

For example, so-called autoclave methods can be carried out at an elevated pressure of approx. 10 bar to 15 bar and temperatures from 130° C. to 145° C. over approx. 2 hours. Vacuum bag or vacuum ring methods known per se operate, for example, at approx. 200 mbar and 80° C. to 110° C. The inner pane, the, for example, thermoplastic intermediate layer, and the outer pane can also be pressed in a calender between at least one pair of rollers to form a pane. Systems of this type are known for producing panes and normally have at least one heating tunnel upstream before a pressing facility. The temperature during the pressing operation is, for example, from 40° C. to 150° C. Combinations of calender and autoclave processes have particularly proved their worth in practice. Alternatively, vacuum laminators can be used. These consist of one or a plurality of heatable and evacuable chambers, in which the inner pane and the outer pane are laminated within, for example, approx. 60 minutes at reduced pressures of 0.01 mbar to 800 mbar and temperatures from 80° C. to 170° C.

In each of the aforementioned methods according to the invention, as a further process step, the galvanic contacting of the transparent, electrically conductive coating can be done by an electrical line connection. The galvanic contacting is preferably done by gluing with an electrically conductive adhesive, soldering, and, in particular, ultrasonic soldering.

In the galvanic contacting, it can be advantageous to first apply an electrically conductive contact layer on the transparent, electrically conductive coatings, for example, by metallization or by printing using a metal-containing screen printing paste and subsequent firing. This contact layer is particularly advantageous for obtaining a low-ohmic and corrosion-stable contact between the conductive components of the transparent, electrically conductive coating and the other connector elements such as foil conductors or round conductors.

Another aspect of the invention includes the use of the composite pane according to the invention with a capacitive sensor for detecting moisture in means of transportation for travel on land, in the air, or on water, in particular in motor vehicles, for example, as a windshield or rear window.

In the following, the invention is explained in detail with reference to drawings and exemplary embodiments. The drawings are schematic representations and not true to scale. The drawings in no way restrict the invention.

Figure 2:
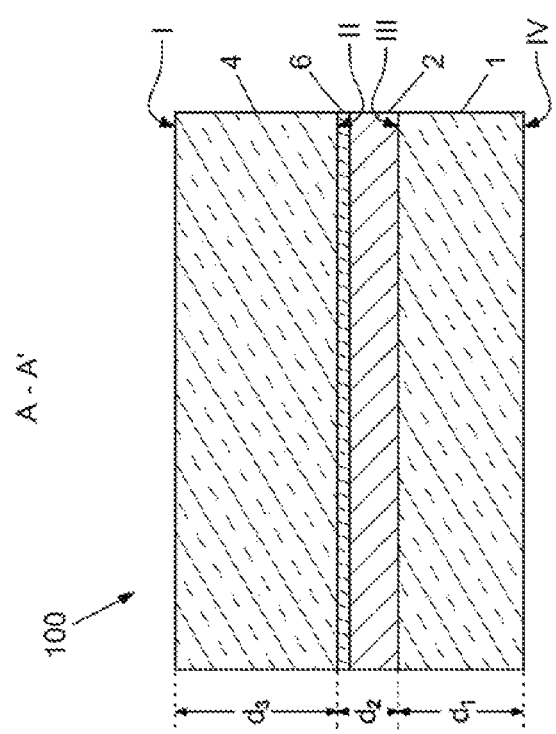
Figure 3:
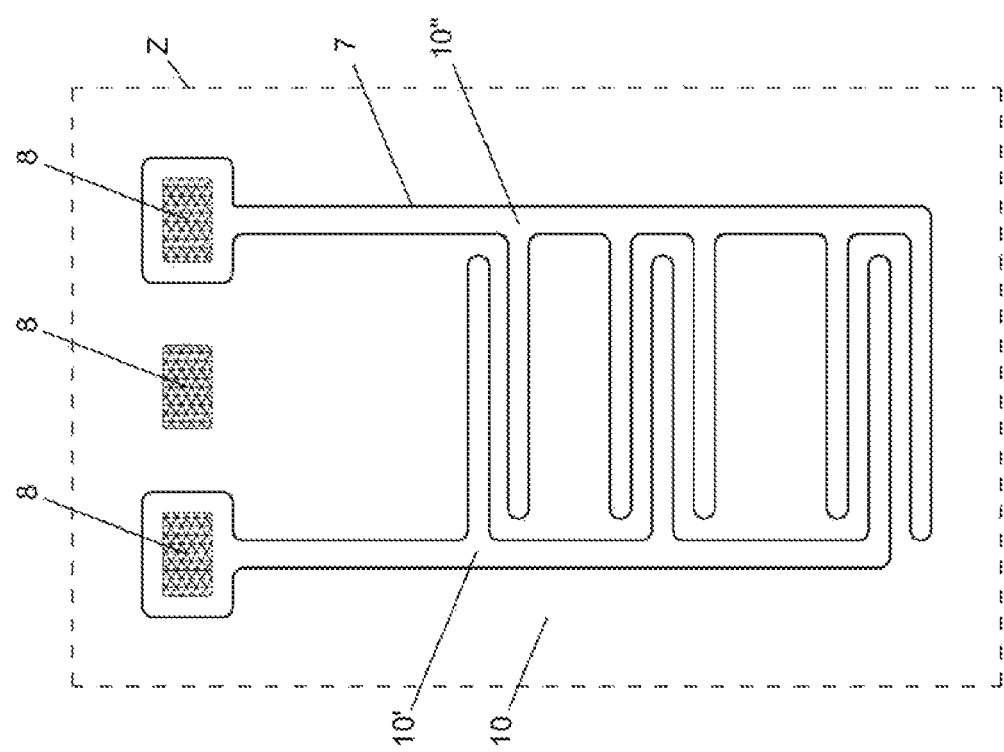
Figure 4:
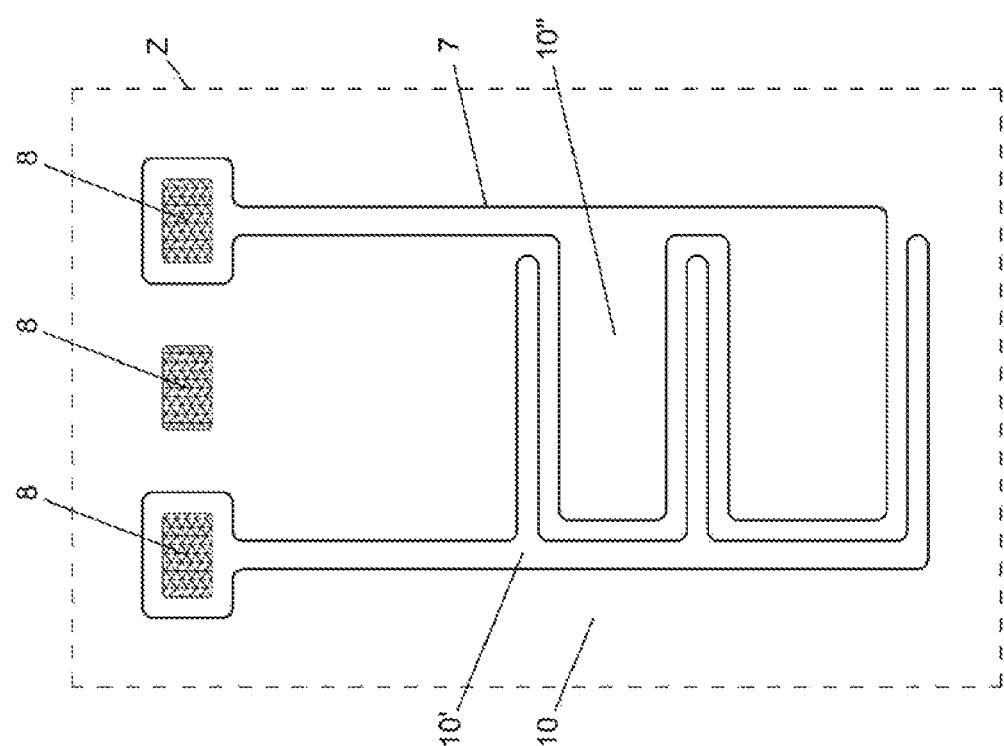
Figure 5:
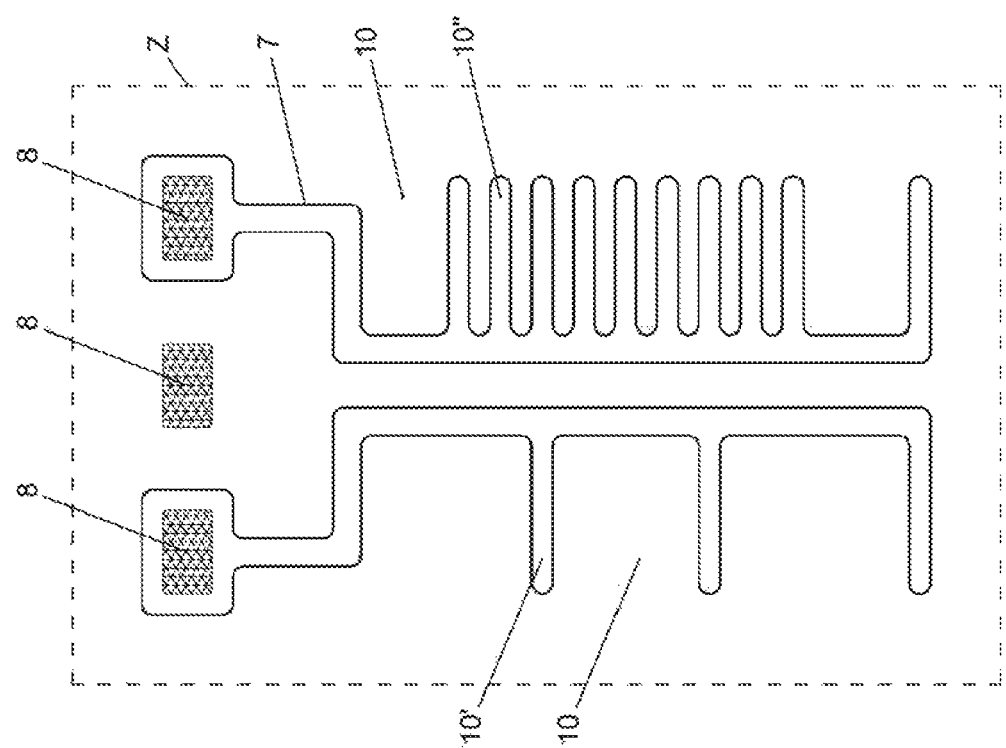
Figure 6:
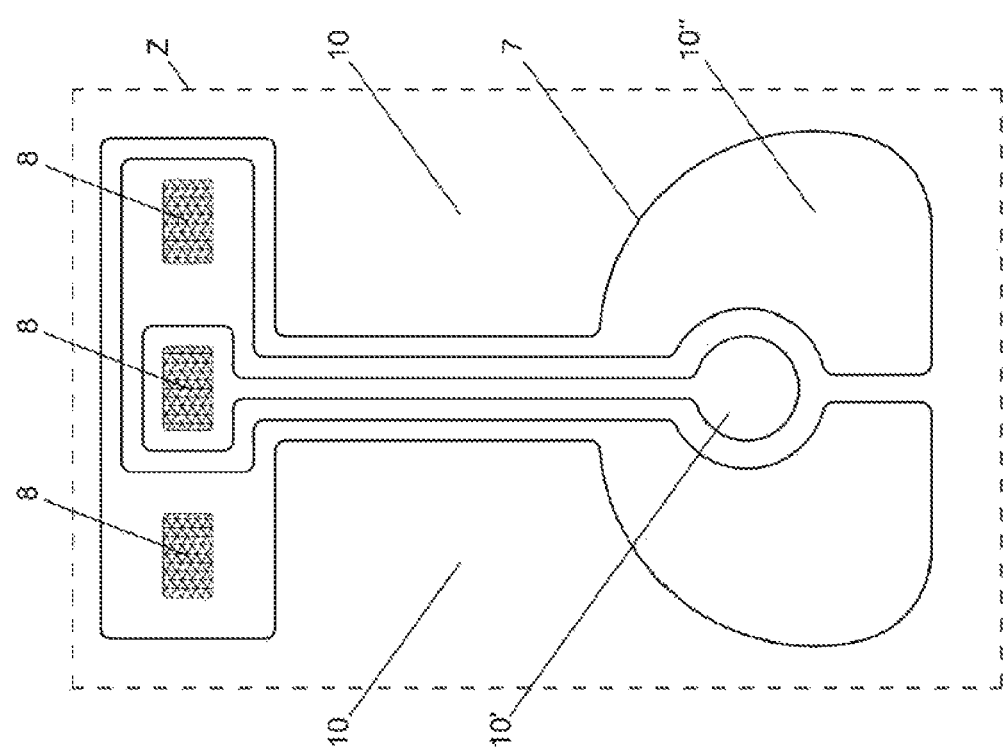

They depict:

FIG. 1 a schematic plan view of an embodiment of a composite pane according to the invention with a capacitive sensor, FIG. 2 a cross-sectional representation along the section line A-A' of FIG. 1;

FIG. 3 an enlarged representation of the detail Z of FIG. 1,

FIG. 4 a first alternative representation of the detail Z of FIG. 1,

FIG. 5 a second alternative representation of the detail Z of FIG. 1,

FIG. 6 a third alternative representation of the detail Z of FIG. 1, and FIG. 7 a fourth alternative representation of the detail Z of FIG. 1.

FIG. 1 depicts a plan view of a composite pane 100 according to the invention using the example of a windshield of a vehicle. The composite pane 100 has, in the upper section of the composite pane 100, a capacitive sensor 3 for detecting moisture on the composite pane 100. In the context of the invention, the expression "moisture" indicates the extent of the presence of water on the composite pane 100 and also includes water in the form of rain. The capacitive sensor 3 measures a change in the dielectric constant or capacitance caused by the moisture or rain. For this purpose, the capacitive sensor 3 has at least one capacitor 5, which is connected via a connector 8 to an electronic sensor unit 14 arranged outside the composite pane 100.

The connector 8 is arranged at the outer edge of the composite pane 100. The distance from the outer edge is less than 10 cm, preferably approx. 0.5 cm. This makes it possible to conceal an electrical contacting of the connector, for example, with a foil conductor, under an optically unobtrusive black print or with a cover, for example, a camera housing.

Furthermore, the capacitor 5 comprises three electrodes 10, 10', 10", which are in each case galvanically separated from one another. The electrodes 10, 10', 10" are arranged in a common plane and capacitively coupled to one another. The electrodes generate a sensor area on an outer surface I of the composite pane, within which the moisture on the composite pane causes a change in capacitance.

The electronic sensor unit is provided to measure a change in capacitance and to route a switching signal to the windshield wiper system as a function of a measured value. For this purpose, the capacitive sensor has a plurality of capacitors 5. The electronic sensor unit 14 is equipped with a microprocessor that calculates a cross-correlationist and/or an autocorrelation of the signals for the evaluation of the values delivered by the capacitors 5. The calculation of the cross-correlation and/or of the autocorrelation is continuously determined and monitored. The switching signal is forwarded via a CAN bus of the vehicle to the windshield wiper system as a function of a threshold value.

The outputted switching signals can be arbitrary and adapted to the requirements of the respective application. Thus, the switching signal can mean a positive voltage, for example, 12 V; no switching signal can mean, for example, 0 V; and a different switching signal can, for example, mean+6 V. The switching signals can also correspond to the voltages CAN_High and CAN_Low customary with a CAN bus and change by a voltage value between them. The switching signal can also be pulsed and/or digitally encoded.

In the autocorrelation of the signals, a sensor measurement value of a capacitor is correlated with the sensor measurement value of the same capacitor at an earlier time. When a calculated autocorrelation coefficient is greater than the predefined threshold value, a cross-correlation of two signals is determined. The two signals include at least one first signal corresponding to a sensor measurement value of a first capacitor and one second signal corresponding to a sensor measurement value of a second capacitor at the same time. The first signal is cross-correlated with the second signal. If the result of the cross-correlation is greater than a second threshold value and not equal to one, the presence of rain on the composite pane is assumed, and a corresponding switching signal that controls the function of the windshield wipers is conveyed to the windshield wiper system.

If the result of the cross-correlation is equal to one, rain is not present on the composite pane 100, and no switching signal is generated.

FIG. 2 depicts a cross-section along the section line A-A' perpendicular to the common plane of the electrodes of FIG. 1. The composite pane 100 comprises at least an inner pane 1, an intermediate layer 2, and an outer pane 4. After final assembly in an installed position, the composite pane 100 separates a vehicle interior from an external environment. The inner surface IV of the inner pane 1 is accessible from the interior and the outer surface I of the outer pane 4 is accessible from the external environment of the vehicle. Furthermore, the outer pane 4 has an inner surface II and the inner pane 1 has an outer surface III.

The inner pane 1 and the outer pane 4 are made, for example, of soda lime glass and were produced in the float method. The thickness d1 of the inner pane 1 is, for example, 2.1 mm. In principle, the panes 1 and 4 can also have different thicknesses.

The intermediate layer 2 can be formed by one or even by a plurality of films arranged one atop another, wherein the thickness of one film is preferably from 0.025 mm to 3 mm, typically 0.38 mm or 0.76 mm. The intermediate layers can preferably be thermoplastic and, after lamination, adhesively bond the inner pane, the outer pane, and any other intermediate layers to one another. The intermediate layer 2 is a thermoplastic intermediate layer and is made, for example, of polyvinyl butyral (PVB). It has a thickness d2 of, for example, 0.76 mm.

The outer pane 4 has, on its inner surface II, a transparent, electrically conductive coating 6. Table 1 presents three examples of transparent, electrically conductive coatings 6 with functional layers, made, for example, of ITO. Each coating 6 of Examples 1-3 consists of a layer stack comprising: outer pane 1/adhesive layer/functional layer/barrier layer/antireflection layer. The thickness $d_3$ of the outer pane 4 is, for example, also 2.1 mm.

TABLE 1

| | | Thickness | | |
|---|---|---|---|---|
| | Material | Example 1 | Example 2 | Example 3 |
| Antireflection layer | SiO$_2$:Al | 45 nm | 40 nm | 80 nm |
| Barrier layer | Si$_3$N$_4$:Al | 12 nm | 20 nm | 12 nm |
| Functional layer | ITO | 120 nm | 120 nm | 120 nm |
| Adhesive layer | SiO$_2$:Al | 30 nm | 30 nm | 40 nm |
| Outer pane 4 or. inner pane 1 | Soda lime glass | | | |

FIG. 3 depicts an enlarged representation of the detail Z of the composite pane 100 of FIG. 1 with the capacitively coupled electrodes 10, 10', 10". The transparent, electrically conductive coating 6 is divided by a coating-free separating line 7 into different, electrodes 10 electrically isolated from one another. In this example, "electrically isolated" means that the regions are galvanically separated from one another, in other words, no direct current (DC) can flow between the regions.

In the example depicted in FIG. 3, two electrodes 10' and 10" are electrically divided by another, third electrode 10. Each electrode 10' and 10" is comb-shaped and consists of a comb back and a plurality of intermeshed comb teeth. In this example, the width of one comb tooth and of the comb back is in each case approx. 1 mm. The comb back is connected to a connector 8. The connector 8 has a rectangular shape with a width of, for example, 12 mm. The length of the comb back is approx. 48 mm. The third electrode 10 is, in turn, separated by a separating line 7 from the rest of the transparent, electrically conductive coating 6. Here, the third electrode 10 is rectangular and comprises both electrodes 10' and 10". The third electrode 10 has an additional connector 8. The additional connector 8 can be arranged as desired within the third electrode 10. In the example depicted, it is arranged at the upper edge of the third electrode 10 at the upper edge of the composite pane 100. As a result, it is visually unobtrusive.

The separating line 7 has a width of, for example, only 100 μm and is introduced into the transparent, electrically conductive coating 6 by laser patterning. Separating lines 7 with such a small width are hardly perceptible visually and hardly disrupt vision through the composite pane 100, which is particularly aesthetic and is of particular importance for driving safety, especially for use in the field of vision of vehicles.

FIGS. 4 to 7 depict alternative representations of the detail Z of FIG. 1. FIGS. 4 and 5 depict alternative forms of the comb-shaped electrodes 10' and 10". FIGS. 6 and 7 depict tulip-shaped embodiments of the electrodes 10' and 10".

LIST OF REFERENCE CHARACTERS 1 inner pane
2 intermediate layer
3 capacitive sensor
4 outer pane
5 capacitor
6 transparent, electrically conductive coating
7 separating line
8 connector
14 electronic sensor unit
100 composite pane
$d_1, d_2, d_3$ thickness
A-A' section line
Z detail
I outer surface of the outer pane 4
II inner surface of the outer pane 4
III outer surface of the inner pane 1
IV inner surface of the inner pane 1

The invention claimed is:
1. Composite pane for separating an interior space from an external environment, comprising:
   an inner pane,
   an outer pane with an inner surface, and
   an intermediate layer that areally joins the inner surface of the outer pane to an outer surface of the inner pane, and
   a capacitive sensor for detecting moisture having at least one capacitor that is connected to an electronic sensor unit, which is provided for detecting a change in capacitance of the capacitor, wherein the capacitor has at least two electrodes formed from a transparent, electrically conductive coating, which are capacitively coupled, wherein the at least two electrodes extend in a common plane of the composite pane and the electrically conductive coating is divided by coating-free separating lines into the at least two electrodes, which are electrically isolated from one another, wherein the at least two electrodes are comb-shaped to form first and second comb-shaped electrodes, wherein the first and second comb-shaped electrodes intermesh, and wherein the first and second comb-shaped electrodes are electrically divided by a third electrode such that each portion of the first and second comb-shaped electrodes is arranged adjacent the third electrode in said common plane and such that two different coating-free separating lines separate a first portion of the first comb-shaped electrode from a second portion of the second comb-shaped electrode, the third electrode extending between the two different coating-free separating lines, and wherein the third electrode is separated by a third separating line from a remainder of the electrically conductive coating.

2. The composite pane according to claim 1, wherein the at least two electrodes are provided for generating a sensor area on the composite pane, inside which moisture on the composite pane causes a change in capacitance.

3. The composite pane according to claim 1, wherein the electronic sensor unit is provided for generating a signal when moisture is detected on a sensor area.

4. The composite pane according to claim 1, wherein the capacitive sensor includes a plurality of capacitors, wherein the electronic sensor unit is provided for generating a plurality of signals and is constructed and arranged to calculate a correlation of the signals.

5. The composite pane according to claim 1, wherein the capacitive sensor is constructed and arranged to calculate an autocorrelation and/or a cross-correlation of the signals.

6. The composite pane according to claim 1, wherein the at least two electrodes have an asymmetric area.

7. The composite pane according to claim 1, wherein the at least two electrodes have a different perimeter.

8. The composite pane according to claim 1, wherein the at least two electrodes are arranged on the surface of the inner pane facing the intermediate layer.

9. The composite pane according to claim 1, wherein the two different coating-free separating lines are not connected to each other.

10. The composite pane according to claim 1, wherein each portion of the first electrode is separated from the second electrode by the two different coating-free separating lines.

11. Method for producing a composite pane according to claim 1, comprising:
    applying a transparent, electrically conductive coating on one surface of the inner pane, of the outer pane, or of the intermediate layer; and introducing at least one separating line, which electrically divides the transparent, electrically conductive coating into at least two capacitively coupled electrodes, and
    producing a stack sequence comprising the inner pane, an intermediate layer, and an outer pane, wherein the intermediate layer is arranged between the inner surface of the outer pane and the outer surface of the inner pane, and laminating the stack sequence to form a composite pane.

12. The method according to claim 11, wherein the at least one separating line is introduced by laser patterning or by mechanical or chemical ablation.

13. A method comprising utilizing the composite pane according to claim 1 in means of transportation for travel on land, in the air, or on water.

14. The method according to claim 13, wherein the composite pane is utilized in motor vehicles.

15. The method according to claim 13, wherein the composite pane is a windshield or rear window.

* * * * *